United States Patent
Kotler et al.

(10) Patent No.: US 11,627,667 B2
(45) Date of Patent: Apr. 11, 2023

(54) HIGH-RESOLUTION SOLDERING

(71) Applicant: Orbotech Ltd., Yavne (IL)

(72) Inventors: Zvi Kotler, Yavne (IL); Ofer Fogel, Yavne (IL)

(73) Assignee: Orbotech Ltd., Yavne (IL)

( * ) Notice: Subject to any disclaimer, the term of this patent is extended or adjusted under 35 U.S.C. 154(b) by 69 days.

(21) Appl. No.: 17/162,835

(22) Filed: Jan. 29, 2021

(65) Prior Publication Data
US 2022/0248540 A1    Aug. 4, 2022

(51) Int. Cl.
| B23K 1/00 | (2006.01) |
| B23K 3/00 | (2006.01) |
| H05K 3/00 | (2006.01) |
| H05K 3/34 | (2006.01) |
| B23K 1/005 | (2006.01) |

(52) U.S. Cl.
CPC ......... *H05K 3/3478* (2013.01); *H05K 3/3468* (2013.01); *H05K 3/3494* (2013.01); *B23K 1/0056* (2013.01); *H05K 2203/107* (2013.01)

(58) Field of Classification Search
CPC ............ C23C 14/048; H05K 2203/107; H05K 3/1283; H05K 3/046; H05K 2203/0528; H05K 1/097; H05K 2203/1131; H05K 2201/0257; H05K 2201/0108; B23K 26/0006; B23K 26/032; B23K 26/082; B23K 26/1224; B23K 26/40; B23K 2101/42; B23K 2101/34; B23K 26/34; B23K 26/352; B23K 1/0056
See application file for complete search history.

(56) References Cited

U.S. PATENT DOCUMENTS

| 4,697,061 A | 9/1987 | Spater et al. |
| 4,906,812 A | 3/1990 | Nied et al. |
| 4,926,022 A | 5/1990 | Freedman |

(Continued)

FOREIGN PATENT DOCUMENTS

| CN | 108018549 A | 5/2018 |
| EP | 3659728 A1 | 6/2020 |
| WO | 2019156555 A1 | 8/2019 |

OTHER PUBLICATIONS

WIPO, International Search Report for International Application No. PCT/US2021/051530, dated May 27, 2021.

(Continued)

*Primary Examiner* — Erin B Saad
(74) *Attorney, Agent, or Firm* — Hodgson Russ LLP

(57) ABSTRACT

A method for circuit fabrication includes defining a solder bump, including a specified solder material and having a specified bump volume, to be formed at a target location on an acceptor substrate. A transparent donor substrate, having a donor film including the specified solder material, is positioned such that the donor film is in proximity to the target location on the acceptor substrate. A sequence of pulses of laser radiation is directed to pass through the first surface of the donor substrate and impinge on the donor film so as to induce ejection from the donor film onto the target location on the acceptor substrate of a number of molten droplets of the solder material such that the droplets deposited at the target location cumulatively reach the specified bump volume. The target location is heated so the deposited droplets melt and reflow to form the solder bump.

29 Claims, 5 Drawing Sheets

(56) References Cited

U.S. PATENT DOCUMENTS

| | | | |
|---|---|---|---|
| 5,008,512 | A | 4/1991 | Spletter et al. |
| 5,021,630 | A | 6/1991 | Benko et al. |
| 5,164,566 | A | 11/1992 | Spletter et al. |
| 5,604,831 | A | 2/1997 | Dittman et al. |
| 7,682,970 | B2* | 3/2010 | Grigoropoulos ..... H05K 3/4685 438/662 |
| 9,607,936 | B2 | 3/2017 | Hsiao et al. |
| 9,859,247 | B2* | 1/2018 | Smits .................. B23K 35/262 |
| 9,925,797 | B2 | 3/2018 | Kotler et al. |
| 2010/0035375 | A1* | 2/2010 | Grigoropoulos ...... H01L 21/288 977/773 |
| 2015/0294951 | A1* | 10/2015 | Smits ..................... B23K 35/26 438/119 |
| 2016/0181217 | A1 | 6/2016 | Prack |
| 2016/0233089 | A1* | 8/2016 | Zenou ............... H01L 21/02601 |
| 2017/0210142 | A1* | 7/2017 | Kotler ................ B23K 26/0676 |
| 2018/0090314 | A1* | 3/2018 | Kotler ................... H01L 21/683 |
| 2019/0263054 | A1* | 8/2019 | Kotler ................... B29C 64/218 |
| 2021/0028141 | A1* | 1/2021 | Zenou ....................... H01L 24/92 |
| 2022/0024223 | A1* | 1/2022 | Altman ............... H01L 51/0013 |

OTHER PUBLICATIONS

Kaur et al., Laser-induced Forward Transfer for Flip-chip Packaging of Single Dies, Journal of Visualized Experiments 97, e52623, Mar. 20, 2015.

Bourell et al., Materials for Additive Manufacturing, CIRP Annuals Manufacturing Technology, vol. 66, p. 659-681, Jun. 9, 2017.

Kruth et al., Consolidation Phenomena in Laser and Powder-Bed Based Layered Manufacturing, Annals of the CIRP vol. 56, p. 730-759, Feb. 2007.

Wang et al., Direct Printing of 1-D and 2-D Electronically Conductive Structures by Molten Lead-Free Solder, MDPI, Materials, vol. 10, No. 1, Dec. 22, 2016.

Lee et al., Drop-on-Demand Solder Droplet Jetting System for Fabricating Microstructure, IEEE Transactions on Electronics Packaging Manufacturing, vol. 31, No. 3, p. 202-210, Jul. 7, 2008.

Nishikawa et al., Formation and Growth of Intermetallic Compound Layers at the Interface During Laser Soldering Using Sn-Ag Cu Solder on a Cu Pad, Journal of Materials Processing Technology, vol. 215, p. 6-11, Aug. 17, 2014.

Kunwar et al., Heat and Mass Transfer Effects of Laser Soldering on Growth Behavior of Interfacial Intermetallic Compounds in Sn/Cu and Sn-3.5Ag0.5/Cu Joints, Microelectronics Reliability, vol. 80, p. 55-67, Nov. 24, 2017.

Vaezi et al., A review on 3D micro-additive technologies, The International Journal of Advanced Manufacturing Technology, Nov. 25, 2012.

Bechtel, Heating of Solid Targets with Laser Pulses, Journal of Applied Physics, vol. 46, No. 4, p. 1585-1593, Apr. 1975.

Pactech, Solder ball jetting machine with wiring process—SB2-WB, available at https://pactech.com/portfolio-items/sb2-wb/.

* cited by examiner

HIGH-RESOLUTION SOLDERING

FIELD OF THE INVENTION

The present invention relates generally to fabrication of electronic devices, and particularly to methods and systems for soldering.

BACKGROUND

In laser direct-write (LDW) techniques, a laser beam is used to create a patterned surface with spatially-resolved three-dimensional structures by controlled material ablation or deposition. Laser-induced forward transfer (LIFT) is an LDW technique that can be applied in depositing micro-patterns on a surface.

In LIFT, laser photons provide the driving force to catapult a small volume of material from a donor film toward an acceptor substrate. Typically, the laser beam interacts with the inner side of the donor film, which is coated onto a non-absorbing carrier substrate. The incident laser beam, in other words, propagates through the transparent carrier substrate before the photons are absorbed by the inner surface of the film. Above a certain energy threshold, material is ejected from the donor film toward the surface of the acceptor substrate. Given a proper choice of donor film and laser beam pulse parameters, the laser pulses cause molten droplets of the donor material to be ejected from the film, and then to land and harden on the acceptor substrate.

LIFT systems are particularly (though not exclusively) useful in printing conductive metal droplets and traces for purposes of electronic circuit fabrication. A LIFT system of this sort is described, for example, in U.S. Pat. No. 9,925,797, whose disclosure is incorporated herein by reference. This patent describes printing apparatus, including a donor supply assembly, which is configured to provide a transparent donor substrate having opposing first and second surfaces and a donor film formed on the second surface so as to position the donor film in proximity to a target area on an acceptor substrate. An optical assembly is configured to direct multiple output beams of laser radiation simultaneously in a predefined spatial pattern to pass through the first surface of the donor substrate and impinge on the donor film so as to induce ejection of material from the donor film onto the acceptor substrate according, thereby writing the predefined pattern onto the target area of the acceptor substrate.

SUMMARY

Embodiments of the present invention that are described hereinbelow provide improved methods and system for fabrication of electrical circuits and devices.

There is therefore provided, in accordance with an embodiment of the invention, a method for circuit fabrication, which includes defining a solder bump, including a specified solder material and having a specified bump volume, to be formed at a target location on an acceptor substrate. A transparent donor substrate, having opposing first and second surfaces and a donor film including the specified solder material on the second surface, is positioned such that the donor film is in proximity to the target location on the acceptor substrate. A sequence of pulses of laser radiation is directed to pass through the first surface of the donor substrate and impinge on the donor film so as to induce ejection from the donor film onto the target location on the acceptor substrate of a number of molten droplets of the solder material such that the droplets deposited at the target location cumulatively reach the specified bump volume. The target location is heated so that the deposited droplets melt and reflow to form the solder bump.

Typically, the droplets have respective droplet volumes that depend on an intensity of the pulses of the laser radiation, and directing the sequence of the pulses includes setting the intensity of the pulses of laser radiation and the number of the pulses in the sequence responsively to the specified bump volume. In a disclosed embodiment, the droplet volumes further depend on a set of pulse parameters consisting of a spot size and duration of the pulses of the laser radiation, and wherein directing the sequence of the pulses further includes adjusting the droplet volumes by varying one or more of the pulse parameters.

In some embodiments, defining the solder bump includes defining first and second solder bumps, having different, respective first and second bump volumes, at different, respective first and second target locations on the same acceptor substrate, and directing the sequence of pulses includes directing different, first and second sequences of the pulses to pass through different points on the donor substrate so that the droplets cumulatively reach each of the different first and second bump volumes at the respective first and second target locations. In one embodiment, defining the first and second solder bumps includes specifying different, respective first and second compositions of the first and second solder bumps, and positioning the transparent donor substrate includes providing one or more donor films including a plurality of different solder materials selected so as to produce the first and second compositions.

Additionally or alternatively, defining the solder bump includes defining first and second solder bumps, having different, respective first and second compositions, and positioning the transparent donor substrate includes providing one or more donor films including a plurality of different solder materials so as to produce the first and second compositions.

Further additionally or alternatively, defining the solder bump includes specifying a composition of the solder bump that includes different, first and second materials, and positioning the transparent donor substrate includes providing first and second donor films including the first and second materials, respectively, and directing the sequence of pulses includes directing first and second sequences of the pulses to impinge respectively on the first and second donor films so that the droplets deposited at the target location cumulatively reach the specified composition. In one embodiment, specifying the composition includes specifying a gradient of the materials in the composition of the solder bump, and directing the first and second sequences of the pulses includes depositing the droplets of the first and second materials in multiple layers on the target location in accordance with the specified gradient.

In some embodiments, directing the sequence of the pulses includes depositing the droplets in multiple layers on the target location so as to reach the specified bump volume. In a disclosed embodiment, heating the target location includes alternately depositing a layer of droplets and heating the layer to melt the droplets multiple times until the specified bump volume is reached.

Additionally or alternatively, defining the solder bump includes specifying a shape of the solder bump, such as a non-circular shape, and directing the sequence of the pulses includes depositing the molten droplets in a pattern that conforms to the specified shape.

In further embodiments, heating the target location includes directing a laser beam to irradiate the target location with sufficient energy to cause the deposited droplets to melt and reflow. Typically, directing the laser beam includes focusing one or more laser pulses onto the target location.

In some embodiments, the method includes printing a conductive pad at the target location on the acceptor substrate using a process of laser-induced forward transfer (LIFT), wherein directing the sequence of the pulses includes depositing the molten droplets of the solder material on the printed conductive pad. In a disclosed embodiment, printing the conductive pad includes forming a concavity in the conductive pad for deposition of the molten droplets therein.

There is also provided, in accordance with an embodiment of the invention, a system for circuit fabrication, including a controller, which is configured to receive a definition of a solder bump, including a specified solder material and having a specified bump volume, to be formed at a target location on an acceptor substrate. A printing station includes a transparent donor substrate, which has opposing first and second surfaces and has a donor film including the specified solder material disposed on the second surface, and which is positioned such that the donor film is in proximity to the target location on the acceptor substrate. A laser is configured to direct a sequence of pulses of laser radiation to pass through the first surface of the donor substrate and impinge on the donor film so as to induce ejection of molten droplets of the solder material from the donor film onto the target location on the acceptor substrate. The controller is configured to drive the printing station to eject a number of the droplets toward the target location such that the droplets deposited at the target location cumulatively reach the specified bump volume. A reflow station is configured to heat the target location so that the deposited droplets melt and reflow to form the solder bump.

There is additionally provided, in accordance with an embodiment of the invention, a method for circuit fabrication, which includes depositing a solder material at one or more target locations on a circuit substrate, and focusing one or more pulses of a laser beam onto each of the target locations with sufficient energy to cause the deposited droplets to melt and reflow so as to form solder bumps.

In a disclosed embodiment, depositing the solder material includes ejecting molten droplets of the solder material toward the one or more target locations.

In some embodiments, the pulses have a pulse duration no greater than 1 ms, and possibly less than 100 µs.

Additionally or alternatively, the pulses have a pulse energy no greater than 2 mJ.

Additionally or alternatively, the pulses have a pulse energy no greater than 3 mJ. In a disclosed embodiment, focusing the one or more pulses includes focusing a single, respective pulse of the laser beam onto each of the target locations.

The present invention will be more fully understood from the following detailed description of the embodiments thereof, taken together with the drawings in which:

DETAILED DESCRIPTION OF EMBODIMENTS

Overview

Figure 1:
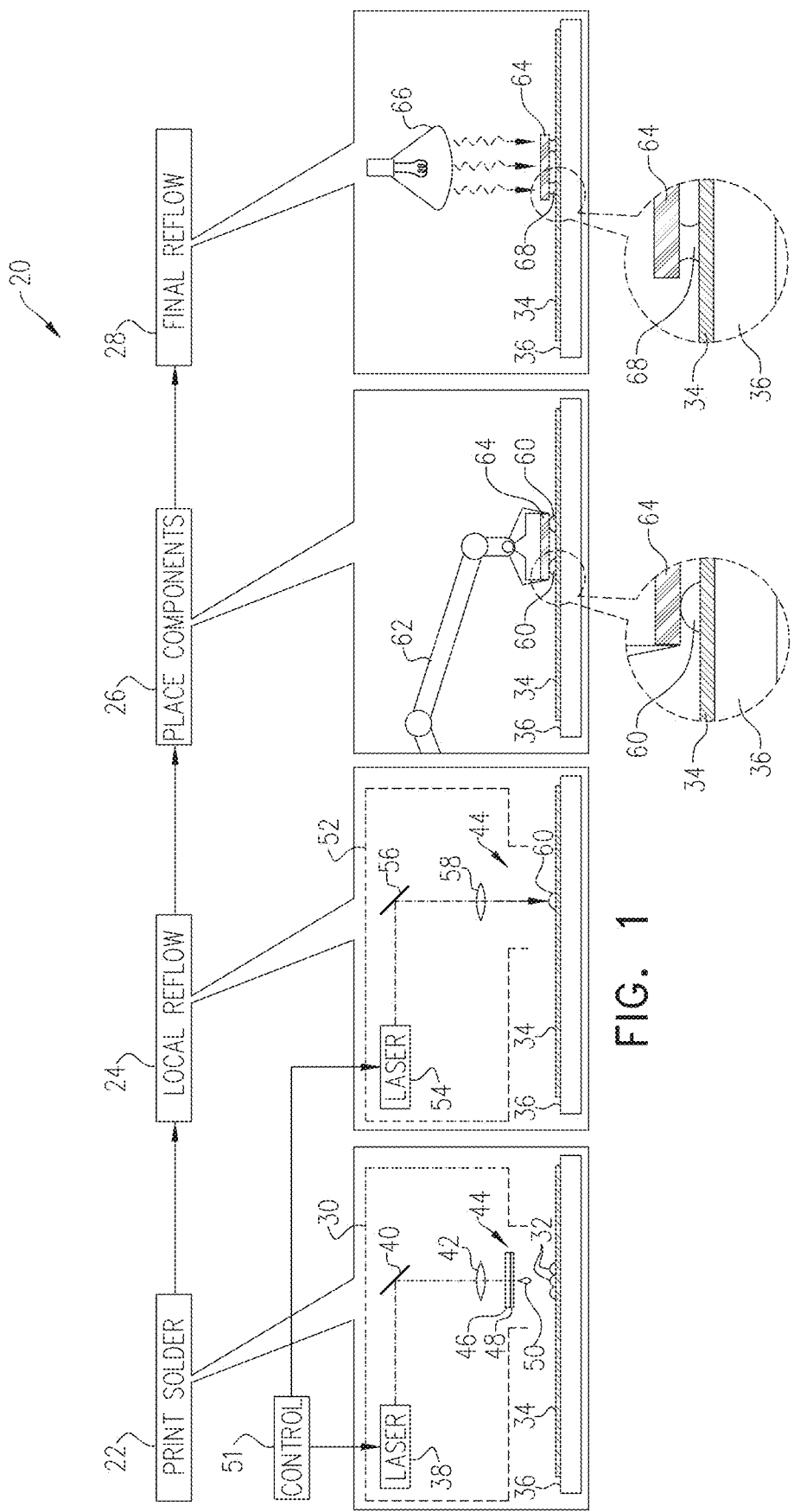
FIG. 1 is block diagram that schematically illustrates a system for electronic circuit fabrication, in accordance with an embodiment of the invention.

In methods of electronic circuit fabrication that are known in the art, electrical traces and contact pads are printed on a circuit substrate, and a solder layer is printed by photolithographic methods onto the contact pads. Circuit components are then placed on the solder-covered pads, and the circuit is heated so as to cause the solder to melt and reflow, thus creating conductive bonds between the components and the pads. In this conventional approach, the pad locations and sizes and the volume of solder material on each contact pad are fixed by the photolithographic mask and solder deposition process.

Embodiments of the present invention provide a LIFT-based method of solder deposition, which is capable of creating, on demand, solder bumps of substantially any desired size and shape and comprising substantially any suitable solder material or a combination of materials. This LIFT-based method is capable of creating multiple bumps having different volumes, shapes and sizes, and even comprising different solder materials and combinations of solder materials, all on the same substrate in the same process steps. The volumes and compositions—including even non-uniform compositions—of the solder bumps can be controlled precisely by setting the LIFT parameters, the donor film materials, and the number of droplets deposited at each target location. Furthermore, in contrast with conventional approaches, the present methods are capable of printing solder bumps on non-uniform substrates, as well as on substrates on which components have already been placed. The disclosed embodiments thus afford far greater flexibility and precision in circuit fabrication than techniques that are known in the art.

In the embodiments that are described hereinbelow, a solder bump is defined in terms of a specified solder material and bump volume and a target location at which the bump is to be formed on an acceptor substrate. A transparent donor substrate, having a donor film comprising the specified solder material on one of its surfaces, is positioned with the donor film in proximity to the target location on the acceptor substrate. (For convenience, the surface of the donor substrate that is in proximity to the acceptor substrate is referred to herein as the lower surface, while the opposite surface of the donor substrate is referred to as the upper surface.) A laser directs a sequence of pulses of laser radiation to pass through the upper surface of the donor substrate and impinge on the donor film so as to induce ejection of a number of molten droplets of the solder material from the donor film onto the target location on the acceptor substrate.

The laser pulse parameters and the number of pulses in the sequence are chosen so that the droplets deposited at the target location cumulatively reach the specified bump volume. The pulse parameters that can be varied in order to control the droplet volumes include the pulse intensity, i.e., the optical power per unit area that is incident on the donor film, as well as the spot size and pulse duration. These parameters can be adjusted, depending on the type and thickness of solder material in the donor film, to give consistent droplet volumes on the order of 0.1 pl (picoliter), i.e., 100 $\mu m^3$, or less, and to ensure ejection of the droplets from the donor film at high speed with precise directionality toward the target location. Thus, by appropriate choice of the pulse parameters and the number of droplets, it is possible to print solder bumps of precise sizes with diameters as small as about 20 µm. Processes in accordance with embodiments of the invention can be used to print a wide range of solder materials, including low, medium, and high-temperature solders, onto a wide variety of substrates, and also facilitate fluxless soldering.

After depositing one or more layers of the droplets on the acceptor substrate, the target location is heated so that the deposited droplets melt and reflow to form the solder bump. The heating is advantageously performed locally, for example by laser irradiation, in order to drive fast reflow and minimize damage to the substrate. The laser pulses used in this stage can be focused narrowly on the solder bumps, and the duration of the laser pulses need be no more than about one millisecond and in most cases less than 100 microseconds, for example a few tens of microseconds (or even less for small solder bumps). Therefore, this laser-driven reflow technique can be carried out in ambient air and is suitable for heat-sensitive substrates. It is particularly well suited for use in conjunction with the LIFT-based solder printing techniques described above; but it may alternatively be applied to reflow solder materials that have been deposited by other methods, such as inkjet-type solder printing and photolithographic techniques. Alternatively, however, the reflow stage may be carried out by heating the entire acceptor substrate, for example in a high-temperature oven. After the solder bumps have been formed, circuit components can be placed on the bumps and soldered in place by conventional methods.

System Description

FIG. 1 is schematic, pictorial illustration of a system 20 for electronic circuit fabrication, in accordance with an embodiment of the invention. System 20 comprises a printing station 22, which receives a definition of solder bumps 60, comprising specified solder materials and having specified bump volumes, to be formed at target locations on an acceptor substrate 34. Printing station deposits a number of droplets 32 of the desired solder material at each target location, such that the droplets cumulatively reach the specified bump volumes. A reflow station 24 heats the target locations so that deposited droplets 32 melt and reflow to form solder bumps 60. This heating process may be concentrated locally on the bump locations, as shown in FIG. 1, or it may be performed globally over the entire substrate 34, depending on the properties of the solder materials and substrate and other application requirements.

Typically, after formation of solder bumps 60, a placement station 26 places components 64 on the solder bumps, for example using a pick-and-place machine 62, as is known in the art. A heat source 66 in a final reflow station 28 then heats the solder bumps in order to form permanent bonds 68 between the components and substrate 34. Heat source 66 may apply local heating, using a laser, for example, or it may comprise a reflow oven or any other suitable type of heater that is known in the art. Bonds 68 typically form both electrical and mechanical connections between components 64 and conductive traces on substrate 34. Alternatively or additionally, solder bumps 60 may be arranged to form a frame, having a rectangular, circular or other shape, so as to create a mechanical seal around the edge of component 64. This sort of sealing can be used, for example, for hermetic packaging of sensitive devices, such as micro-electromechanical systems (MEMS) devices.

Referring back to printing station 22, an optical assembly 30 in the printing station comprises a laser 38, which directs short pulses of optical radiation, with pulse duration on the order of 1 ns, toward a donor foil 44 under the control of a controller 51. (The term "optical radiation," as used in the context of the present description and in the claims, refers to electromagnetic radiation in any of the visible, ultraviolet and infrared ranges; while "laser radiation" refers to optical radiation emitted by a laser.) Controller 51 typically comprises a general-purpose computer or special-purpose microcontroller, which has suitable interfaces to the other elements of system 20 and which is driven in software to perform the functions that are described herein. Donor foil 44 typically comprises a thin, flexible sheet of a transparent donor substrate 46, which is coated on the side in proximity to acceptor substrate 34 with a donor film 48 comprising a specified solder material or materials.

Alternatively, the donor substrate may comprise a rigid or semi-rigid material. Acceptor substrate 34 may comprise any suitable material, such as glass, ceramic, or polymer, as well as other dielectric, semiconducting, or even conductive materials.

Figure 2A:
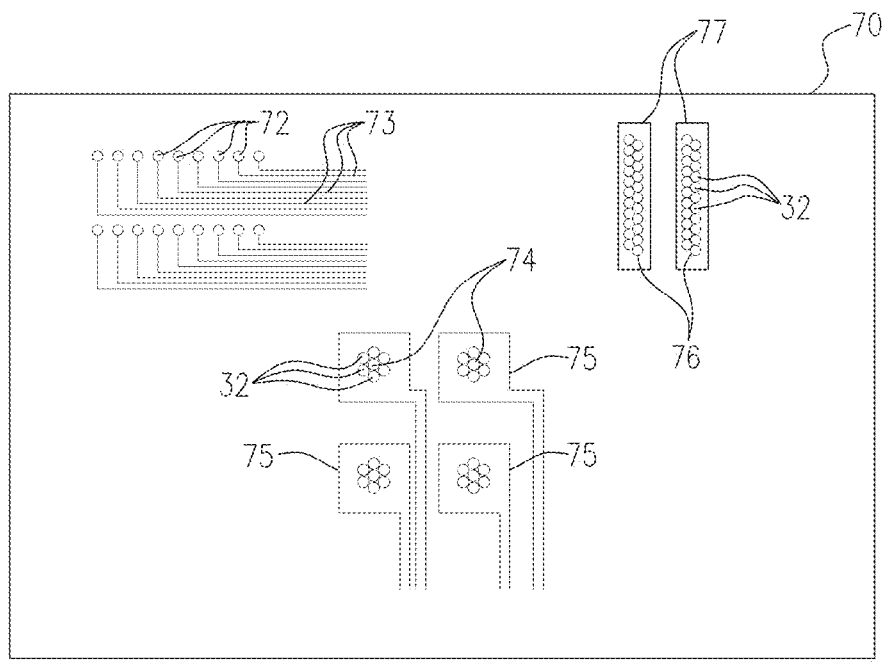
FIG. 2A is a schematic frontal view of a printed circuit substrate on which droplets of solder have been deposited in a LIFT process, in accordance with an embodiment of the invention.
Figure 2B:
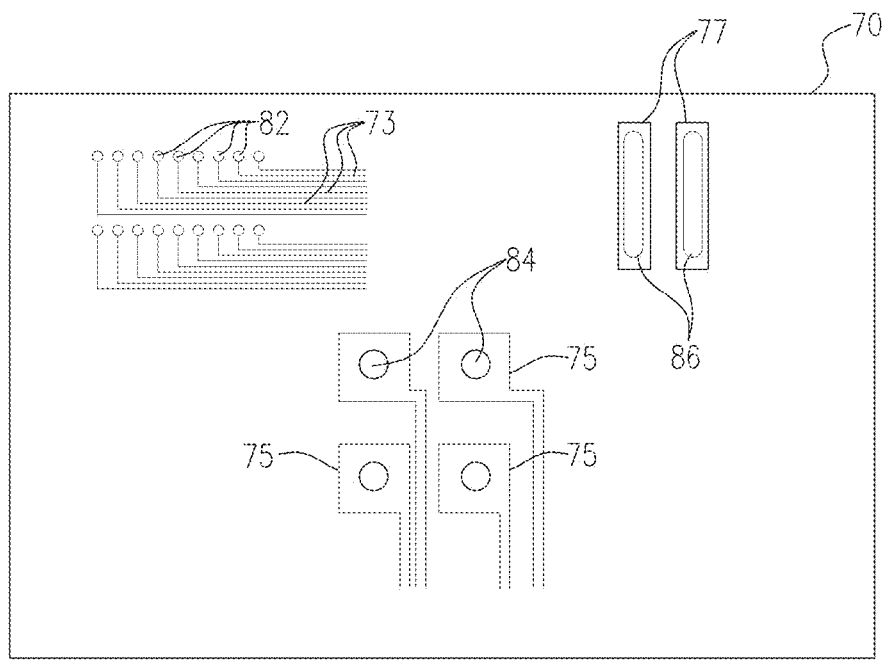
FIG. 2B is a schematic frontal view of the printed circuit substrate of FIG. 2A following reflow of the solder, in accordance with an embodiment of the invention.

Optical assembly 30 comprises a beam deflector 40 and focusing optics 42, which direct one or more output beams of radiation from laser 38 to pass through the upper surface of donor substrate 46 and thus impinge on donor film 48 on the lower surface, following a spatial pattern determined by controller 51. In an example embodiment, beam deflector 40 comprises an acousto-optic modulator, as shown in FIG. 2A or 2B of the above-mentioned U.S. Pat. No. 9,925,797 and described in columns 7-8 of this patent. The laser is typically controlled to output a train of pulses of a suitable wavelength, duration and energy so as to induce ejection of molten droplets 50 of the solder material from donor film 48 onto the specified target locations on acceptor substrate 34. Because droplets 50 are ejected from donor film 48 in a direction perpendicular to donor substrate 46 and at high speed, donor foil 44 may be positioned at a small distance from acceptor substrate 34, for example with a spacing up to about 0.5 mm between donor film 48 and acceptor substrate 34, rather than in contact with the acceptor substrate. Because of the high speed of ejection of droplets 50 (typically 10 m/sec or more), the time of flight of the droplets is less than the time it takes for the droplets to solidify, and printing station 22 may operate in ambient atmospheric conditions, rather than under vacuum.

Donor film 48 may comprise substantially any suitable type of solder material or combination of solder materials, including low-, medium- and high-temperature solders. Low— and medium-temperature solders include, for example, tin-lead and tin-silver-copper (SAC) alloys. High-temperature solders, which are most commonly used in fabricating high-power electronic devices, include alloys of silver (typically 45-90%) with other metals, such as copper, zinc, tin and cadmium, and typically melt at temperatures in the range of 700–950° C. The thickness and composition of film 48, as well as the pulse parameters of optical assembly 30, are adjusted depending on the choice of solder materials in order to give stable jetting of molten droplets 50 of the solder material toward target locations on acceptor substrate 34.

In some embodiments, multi-layered and structured donor films 48 may be used in order to deposit droplets 32 of mixed compositions. For example, donor foil 44 may comprise multiple, layered donor films comprising different, respective solder compositions, in order to create molten droplets 50 containing a bulk mixture of the different materials. Multi-composition LIFT schemes of this sort are described, for example, in U.S. Pat. No. 10,629,442, whose disclosure is incorporated herein by reference.

Alternatively or additionally, donor foil 44 may comprise donor films 48 comprising different materials at different locations on the donor foil. Optical assembly directs sequences of laser pulses to impinge respectively on the different donor locations so that the droplets 32 of the different materials that are deposited at a given target location cumulatively reach a specified volume and composition. Mixed-composition schemes of this sort are described further hereinbelow with reference to FIGS. 4A/B.

Controller 51 adjusts the pulse parameters of laser 38 and the scanning and focusing parameters of optical assembly 30 in order to deposit the appropriate number of droplets 32 of the desired volumes onto each target location at which a solder bump is to be formed on acceptor substrate 34. As explained earlier, controller 51 sets the laser pulse parameters and the number of molten droplets of the solder material such that the droplets deposited at each target location cumulatively reach the specified bump volume at that location. Since the droplet volume can be varied by adjusting the laser pulse parameters, a given bump volume can be created by depositing a smaller number of droplets of a larger volume or a larger number of droplets of smaller volume. The thickness of donor film 38 also contributes to the droplet size Given the inherent tolerances in the actual droplet volume, however, it may be advantageous to rely on large-numbers statistics, and use smaller droplets in larger numbers rather than a small number of larger droplets, in particular when dealing with very small bumps Printing station 22 also comprises a positioning assembly, which may comprise an X-Y stage 36, for example, on which acceptor substrate 34 is mounted. Stage 36 shifts acceptor substrate 34 relative to optical assembly 30 and donor foil 44 in printing station 22 so as to deposit droplets 32 at different target locations across the surface of the acceptor substrate. Additionally or alternatively, the positioning assembly may comprise motion components (not shown) that shift optical assembly 30, as well as donor film 44, if appropriate, over the surface of the acceptor substrate.

Reflow station 24 comprises an optical assembly 52, which directs a beam of radiation so as to melt droplets 32 locally, thus causing the droplets to coalesce into solder bumps 60. Local heating of this sort is advantageous particularly in avoiding damage to sensitive acceptor substrates 34. Optical assembly 52 in the pictured example comprises a laser 54, together with a beam deflector 56 and focusing optics 58, which direct the laser radiation to irradiate the target location with sufficient energy to cause the deposited droplets to melt and reflow into solder bump 60. Reflow station 24 also comprises a positioning assembly, which may be based on the same stage 36 as in printing station 22, or a different stage or other motion device.

Controller 51 adjusts the pulse parameters of laser 54 and the scanning and focusing parameters of optical assembly 52 in order to apply sufficient energy to melt and reflow each solder bump 60, while avoiding damage to substrate 34. The pulse duration and energy are chosen so that the solder material at the bottom of each bump melts fully, without vaporizing the solder material at the top of the bump. The actual power and pulse duration required depend on the melting temperature and thermal conductivity of the solder material. Short laser pulses are generally favored for this purpose, since they minimize the time during which the solder material is molten, and thus minimize oxidation and avoid damage to substrate 34. Reflow station 24 is thus able to operate in ambient atmospheric conditions. Short, high-power laser pulses are particularly advantageous in enabling fluxless reflow and supporting the use of high-temperature solder materials. A single laser pulse of this sort, focused onto the location of each solder bump, is typically sufficient to achieve full reflow of small solder bumps, although multiple pulses may alternatively be used, particularly for larger solder bumps. The resulting fast local reflow process is also beneficial in reducing the formation of intermetallic compounds between the solder bump and contact pad, and thus creating a stronger solder bond by comparison with methods of thermal reflow that are known in the art.

For small solder bumps, made from a pile of droplets 32 of tin-based solder with a thickness of 20-30 μm, for example, a laser pulse having an optical power of approximately 10 W and duration of 50-100 μs is typically sufficient to achieve complete reflow, while avoiding substantial heat diffusion to the substrate. The optimal laser wavelength, pulse power, duration, and focal size in each case can be chosen in each case to match the absorption spectrum, volume and thermal properties of the solder material. For solder bumps of small to moderate size, the pulse energy need be no greater than about 2 mJ. The optimal laser parameters can be determined empirically and/or on the basis of thermal and fluid dynamics simulations, for instance using finite-element analysis tools that are known in the art.

In the following examples laser 54 in reflow station 24 may be a high-power CW Nd:YAG laser, operating at 1064 nm. Alternatively, laser 54 may be diode pumped fiber laser, for example Ytterbium Continuous Wave Fiber Lasers in the 976 nm—1075 nm range and tens of Watts of power (available for example from IPG).

Alternatively, laser 54 may be a high power diode laser module, for example diode laser modules manufactured by BTW. Other types of lasers will be apparent to those skilled in the art after reading the present description.

In an example implementation, printing station 22 prints bumps using a tin-based solder. To reflow bumps having a volume of about 40 pl (corresponding to a bump diameter of about 50 μm), laser 54 is set to output pulses with a pulse energy of about 0.45 to 1.6 mJ and duration of 50-150 μs. Optical assembly 52 focuses the beam to a spot size of about 35-50 μm on the solder bump. On the other hand, for smaller bumps having for example a volume of about 15 pl (corresponding to a diameter of about 25 μm), laser 54 in reflow station 24 is set to output pulses with a pulse energy of about 0.2 to 0.45 mJ and duration of 10-30 μs focused to a spot size of about 15 to 25 μm on the solder bump.

In another example, to reflow bumps having a volume of about 85 pl (corresponding to a bump diameter of about 100 μm), laser 54 is set to output pulses with a pulse energy of about 1 to 3 mJ and duration of 50-150 μs. Optical assembly 52 focuses the beam to a spot size of about 50 to 100 μm on the solder bump.

Alternative choices of laser-driven reflow parameters will be apparent to those skilled in the art after reading the present description.

In one embodiment, printing station 22 and reflow station 24 are combined into a single operating unit, with an optical assembly that provides laser radiation for both the LIFT and reflow processes. The same laser source may be used for both purposes, as long as the laser source is capable of providing the different ranges of pulse energies and durations that are required for LIFT and reflow. Alternatively, the combined station may include two or more different laser sources, with a shared positioning assembly and possibly shared optics.

Formation of Solder Bumps

Reference is now made to FIGS. 2A/B, which schematically illustrate a process of formation of solder bumps on a printed circuit substrate 70, in accordance with an embodiment of the invention. FIG. 2A is a frontal view of substrate 70 on which droplets 32 of solder have been deposited by a LIFT process, for example in printing station 22 (FIG. 1), while FIG. 2B is a schematic frontal view of substrate 70 following reflow of the solder. This embodiment illustrates the use of the techniques described herein in defining and producing solder bumps having different, respective bump volumes, shapes and/or compositions of solder materials at different target locations on the same acceptor substrate (i.e., substrate 70 in the present example).

As shown in FIG. 2A, before depositing solder bumps on substrate 70, electronic traces 73 and various contact pads 72, 75, 77 of different sizes and shapes are formed on the substrate. These pads and traces may be printed on substrate 70 using a photolithographic process, as is known in the art, or they may alternatively be written directly onto substrate 70, for example using a LIFT process. LIFT printing of contact pads can be advantageous in enhancing adhesion of the solder material to the contact pads, as explained further hereinbelow with reference to FIGS. 5A/B. Controller 51 is programmed to specify the different solder bump volumes that are to be produced on the different solder pads. The controller drives optical assembly 30 to direct different sequences of laser pulses to pass through different points on the donor substrate so that the deposited droplets 32 cumulatively reach the specified bump volumes on the various pads. Thus, for example, only a single droplet 32 or a small number of droplets are deposited on each of pads 72, while larger assemblages 74 of droplets are deposited on pads 75. When very fine contacts are required, as in the case of pads 72, it is also possible to deposit droplets directly onto target locations on traces 73, without dedicated contact pads, and thus solder components directly to the traces.

As noted earlier, by appropriate choice and configuration of donor film 48, printing station 22 may be controlled to print different, respective compositions of solder material onto different contact pads. For example, printing station 22 may print a low-temperature solder, which is appropriate for delicate contacts, onto pads 72, while printing a higher-temperature solder onto pads 75, which are designed to carry higher operating currents in operation of the circuit on substrate 70. Optical assembly 30 directs the laser pulses to pass through the appropriate points on donor substrate 46 in order to deposit solder material of the appropriate composition onto each of the contact pads or locations.

Controller 51 can additionally be programmed to specify different shapes of solder bumps, including non-circular shapes, such as the elongated shapes defined by contact pads 77. Controller 51 then drives optical assembly 30 to direct sequences of laser pulses to pass through the donor substrate so that droplets 32 are deposited on each contact pad in a pattern that conforms to the specified shape. Thus, elongated assemblages 76 of droplets are deposited on contact pads 77. Solder contacts can be printed in this manner in substantially any desired shape, including annular and angled shapes, for example.

After deposition of droplets 32, substrate 70 is heated, causing the droplets to melt and reflow, thus coalescing into solder bumps 82, 84, 86, as shown in FIG. 2B. The tendency of the droplets at this stage is to coalesce into spherical shapes, which minimize the surface energy. To minimize this tendency, particularly in creating solder bumps of non-circular shape, reflow station 24 can apply short, intense laser pulses to melt the solder bumps locally, as explained above. The laser pulse parameters and irradiation pattern in reflow station 24 can be adjusted in order to achieve the desired shape characteristics.

FIGS. 3A, 3B, 3C and 3D are schematic sectional views of a circuit substrate showing successive stages in a process of deposition and reflow of a solder bump 94 on substrate 70, in accordance with another embodiment of the invention. This embodiment addresses a problem of reflow that can arise particularly in large solder bumps: When the process of deposition is carried out in a single stage, a laser pulse of high energy may be required in order to melt droplets 32 at the bottom of the solder bump. The high pulse energy increases the risk of damage to the substrate surrounding the solder bump. On the other hand, if the laser pulse energy is not sufficient, the droplets at the bottom of the bump may not melt completely, resulting in poor contact integrity and increased electrical resistance.

To address this problem, droplets 32 are deposited in multiple layers on a target location so as to reach a specified bump volume. Substrate 70 is shuttled between printing station 22 and reflow station 24 multiple times in order to alternately deposit a layer of droplets and then to heat the layer so as to melt the droplets, until the specified bump volume is reached. Alternatively, LIFT printing and melting of the droplets may be carried out within a single station in which the optical assembly has the capabilities required for both LIFT printing and reflow. In either case, the energy that must be applied to melt each successive layer of droplets is relatively small, and the risk of damage is therefore reduced.

Figure 3A:
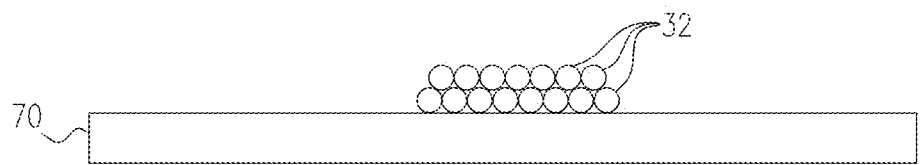
FIGS. 3A, 3B, 3C and 3D are schematic sectional views of a circuit substrate showing successive stages in a process of deposition and reflow of a solder bump, in accordance with an embodiment of the invention.

Thus, in the pictured example, an initial layer of droplets 32 is deposited on substrate 70, as shown in FIG. 3A (or more precisely, on a contact pad on the substrate).

Figure 3B:
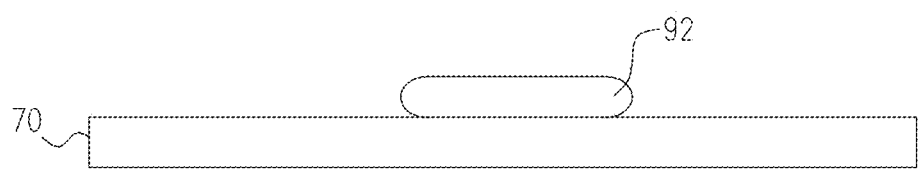
Figure 3C:
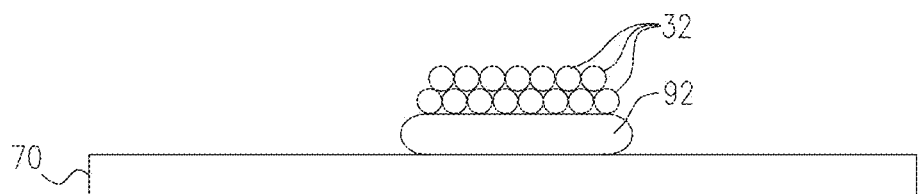
Figure 3D:
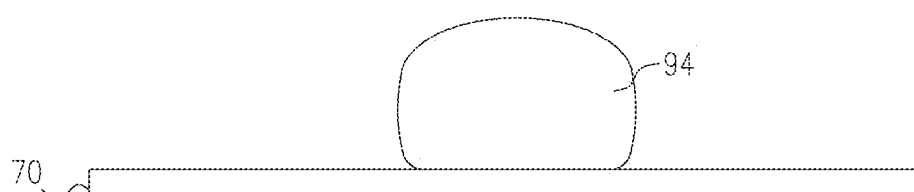

This layer is heated and thus melts to form a reflowed layer 92, as shown in FIG. 3B. A further layer of droplets 32 is deposited over reflowed layer 92, as shown in FIG. 3C, and is then heated so as to reflow again, as shown in FIG. 3D. This process is repeated for as many cycles as are needed to produce solder bump 94.

Figure 4A:
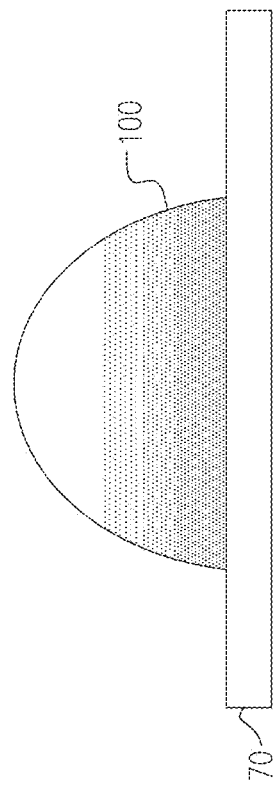
FIG. 4A is a schematic sectional view of a circuit substrate on which droplets of two different solder materials have been deposited in a LIFT process, in accordance with an embodiment of the invention.
Figure 4B:
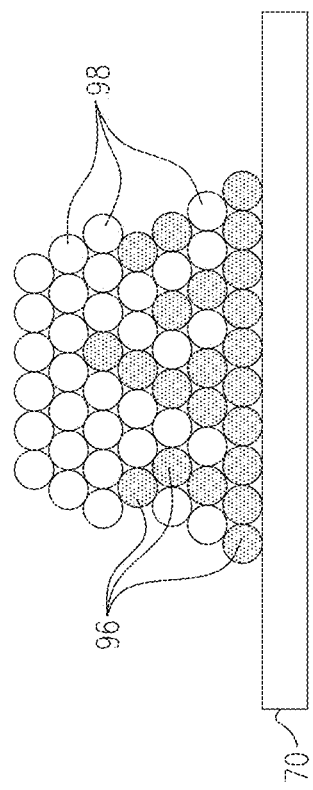
FIG. 4B is a schematic frontal view of the circuit substrate of FIG. 4A following reflow of the solder materials, in accordance with an embodiment of the invention.

Reference is now made to FIGS. 4A/B, which schematically illustrate a process for creating a solder bump 100 of mixed composition on substrate 70, in accordance with an embodiment of the invention. FIG. 4A is a sectional view showing droplets 96 and 98 of two different, respective solder materials that are deposited by the LIFT process in printing station 22. FIG. 4B is a frontal view of solder bump 100 following reflow of the solder materials in reflow station 24.

Controller 51 receives a specification of solder bump 100 indicating that the solder bump is to include two (or more) different materials in a certain ratio. For example, for enhanced mechanical strength and/or conductivity, the solder bump may comprise grains of copper mixed in with a tin solder, or palladium mixed into SAC solder. In some cases, it can also be advantageous that the different materials be distributed non-uniformly within the solder bump, with a specified gradient of the materials. For example, one of the materials, such as the material in droplets 96, may have a higher concentration at the bottom of the solder bump, with concentration decreasing, relative to the material in droplets 98, toward the top of the solder bump. This sort of gradient composition of palladium and copper, with higher palladium concentration at the bottom of the bump, is believed to improve the strength of the solder joint, as explained, for example, in U.S. Pat. No. 9,607,936.

In the example shown in FIG. 4A, donor foil 44 comprises two donor films 48, which comprise two different donor materials, such as the different sorts of materials noted above. Optical assembly 30 directs laser pulses toward one of the donor films to deposit droplets 96 on substrate 70, and toward the other donor film to deposit droplets 98. The number of pulses directed toward each of the donor films is selected so that droplets 96 and 98 are deposited in the proper ratio and cumulatively reach the specified composition and total solder bump volume. To create a gradient composition, the ratio of pulses directed toward the two donor films, and thus the ratio of droplets 96 to droplets 98, changes layer by layer from the bottom of the droplet up to the top, as shown in FIG. 4A. Rapid heating of the assemblage of droplets 96 and 98 in reflow station 24 will cause the droplets to coalesce into solder bump 100 with minimal mixing, so that the specified gradient is maintained, as illustrated schematically in FIG. 4B.

This sort of multi-material deposition of solder bumps can be useful in other applications, as well. For example, the bottom layer of a solder bump can be made by printing droplets of a material that improves or, alternatively, limits solder wetting. As another example, the bottom layer may be chosen to improve the matching of coefficients of thermal expansion between the substrate and the solder material. This property can be finely tuned by mixing two materials with different thermal expansion coefficients so as to match that of the substrate.

Figure 5A:
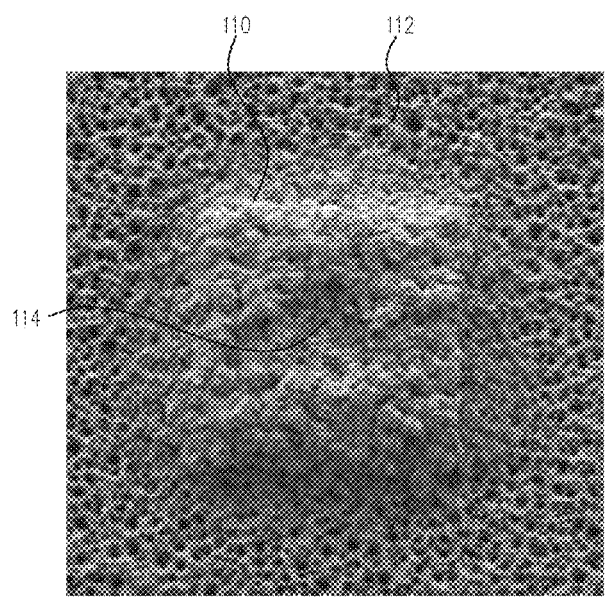
FIG. 5A is a photomicrograph of a contact pad formed by a LIFT process, in accordance with an embodiment of the invention.

FIG. 5A is a photomicrograph of a contact pad 110 formed on a substrate 112 by a LIFT process, in accordance with an embodiment of the invention. In other words, the contact pad is directly written onto substrate 112 by LIFT, using a suitable copper donor film 48, for example, rather than creating the contact pad by conventional photolithographic printing. LIFT printing of contact pad 110 is useful in controlling the shape and texture of the contact pad, in order to improve adhesion of the solder bump to the pad. Thus, as shown in the figure, contact pad 110 has a roughened surface, with a concavity 114 in the center of the pad.

Figure 5B:
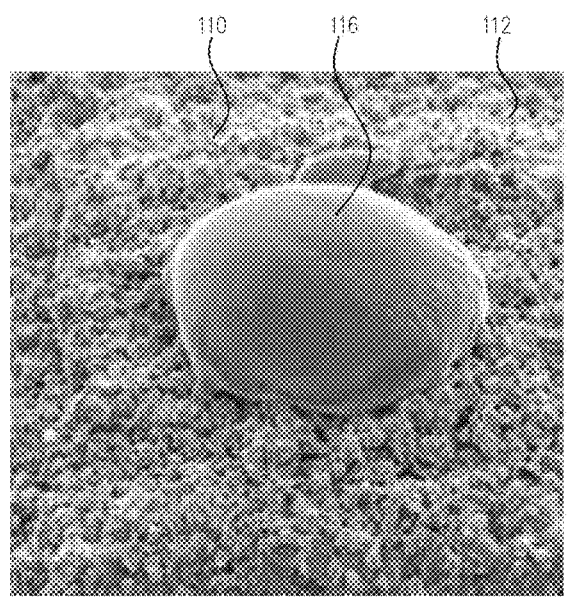
FIG. 5B is a photomicrograph of a solder bump formed on the contact pad of FIG. 5A, in accordance with an embodiment of the invention.

FIG. 5B is a photomicrograph showing a solder bump 116 formed on contact pad 110, in accordance with an embodiment of the invention. Solder bump 116 is formed by printing station 22 in the manner described above, by deposition of droplets of solder material in concavity 114, followed by melting of the droplets in reflow station 24. The roughness of the contact pad gives an increased surface area for adhesion of the solder material to the pad, and together with the concavity helps to ensure good electrical and mechanical contact.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A method for circuit fabrication, comprising: defining a solder bump, comprising a specified solder material and having a specified bump volume, to be formed at a target location on an acceptor substrate;
    positioning a transparent donor substrate having opposing first and second surfaces and a donor film comprising the specified solder material on the second surface such that the donor film is in proximity to the target location on the acceptor substrate;
    directing a sequence of pulses of laser radiation to pass through the first surface of the donor substrate and impinge on the donor film so as to induce ejection from the donor film onto the target location on the acceptor substrate of a number of molten droplets of the solder material such that the droplets deposited at the target location cumulatively reach the specified bump volume; and
    heating the target location so that the deposited droplets melt and reflow to form the solder bump.

2. The method according to claim 1, wherein the droplets have respective droplet volumes that depend on an intensity of the pulses of the laser radiation, and wherein directing the sequence of the pulses comprises setting the intensity of the pulses of laser radiation and the number of the pulses in the sequence responsively to the specified bump volume.

3. The method according to claim 2, wherein the droplet volumes further depend on a set of pulse parameters consisting of a spot size and duration of the pulses of the laser radiation, and wherein directing the sequence of the pulses further comprises adjusting the droplet volumes by varying one or more of the pulse parameters.

4. The method according to claim 1, wherein defining the solder bump comprises defining first and second solder bumps, having different, respective first and second bump volumes, at different, respective first and second target locations on the same acceptor substrate, and
    wherein directing the sequence of pulses comprises directing different, first and second sequences of the pulses to pass through different points on the donor substrate so that the droplets cumulatively reach each of the different first and second bump volumes at the respective first and second target locations.

5. The method according to claim 4, wherein defining the first and second solder bumps comprises specifying different, respective first and second compositions of the first and second solder bumps, and wherein positioning the transparent donor substrate comprises providing one or more donor films comprising a plurality of different solder materials selected so as to produce the first and second compositions.

6. The method according to claim 1, wherein defining the solder bump comprises defining first and second solder bumps, having different, respective first and second compositions, and wherein positioning the transparent donor substrate comprises providing one or more donor films comprising a plurality of different solder materials so as to produce the first and second compositions.

7. The method according to claim 1, wherein defining the solder bump comprises specifying a composition of the solder bump that includes different, first and second materials, and wherein positioning the transparent donor substrate comprises providing first and second donor films comprising the first and second materials, respectively, and wherein directing the sequence of pulses comprises directing first and second sequences of the pulses to impinge respectively on the first and second donor films so that the droplets deposited at the target location cumulatively reach the specified composition.

8. The method according to claim 7, wherein specifying the composition comprises specifying a gradient of the materials in the composition of the solder bump, and wherein directing the first and second sequences of the pulses comprises depositing the droplets of the first and second materials in multiple layers on the target location in accordance with the specified gradient.

9. The method according to claim 1, wherein directing the sequence of the pulses comprises depositing the droplets in multiple layers on the target location so as to reach the specified bump volume.

10. The method according to claim 9, wherein heating the target location comprises alternately depositing a layer of droplets and heating the layer to melt the droplets multiple times until the specified bump volume is reached.

11. The method according to claim 1, wherein defining the solder bump comprises specifying a shape of the solder bump, and wherein directing the sequence of the pulses comprises depositing the molten droplets in a pattern that conforms to the specified shape.

12. The method according to claim 1, wherein heating the target location comprises directing a laser beam to irradiate the target location with sufficient energy to cause the deposited droplets to melt and reflow.

13. The method according to claim 1, and comprising printing a conductive pad at the target location on the acceptor substrate using a process of laser-induced forward transfer (LIFT), wherein directing the sequence of the pulses comprises depositing the molten droplets of the solder material on the printed conductive pad.

14. The method according to claim 13, wherein printing the conductive pad comprises forming a concavity in the conductive pad for deposition of the molten droplets therein.

15. A system for circuit fabrication, comprising:
a controller, which is configured to receive a definition of a solder bump, comprising a specified solder material and having a specified bump volume, to be formed at a target location on an acceptor substrate;
a printing station, which comprises:
a transparent donor substrate, which has opposing first and second surfaces and has a donor film comprising the specified solder material disposed on the second surface, and which is positioned such that the donor film is in proximity to the target location on the acceptor substrate; and
a laser, which is configured to direct a sequence of pulses of laser radiation to pass through the first surface of the donor substrate and impinge on the donor film so as to induce ejection of molten droplets of the solder material from the donor film onto the target location on the acceptor substrate,
wherein the controller is configured to drive the printing station to eject a number of the droplets toward the target location such that the droplets deposited at the target location cumulatively reach the specified bump volume; and
a reflow station configured to heat the target location so that the deposited droplets melt and reflow to form the solder bump.

16. The system according to claim 15, wherein the droplets have respective droplet volumes that depend on an intensity of the pulses of the laser radiation and on a set of pulse parameters consisting of a spot size and duration of the pulses of the laser radiation, wherein the controller is configured to set the intensity of the pulses of laser radiation and the number of the pulses in the sequence responsively to the specified bump volume, and wherein the controller is configured to adjust the droplet volumes by varying one or more of the pulse parameters.

17. The system according to claim 15, wherein the controller is configured to receive definitions of first and second solder bumps, having different, respective first and second bump volumes, at different, respective first and second target locations on the same acceptor substrate, and wherein the controller is configured to drive the laser to direct different, first and second sequences of the pulses to pass through different points on the donor substrate so that the droplets cumulatively reach each of the different first and second bump volumes at the respective first and second target locations, and wherein the definitions of the first and second solder bumps specify different, respective first and second compositions of the first and second solder bumps, and wherein one or more donor films comprising a plurality of different solder materials are disposed on the second surface of the donor substrate, wherein the solder materials are selected so as to produce the first and second compositions.

18. The system according to claim 15, wherein the controller is configured to receive definitions of first and second solder bumps, having different, respective first and second compositions, and wherein one or more donor films comprising a plurality of different solder materials are disposed on the second surface of the donor substrate, wherein the solder materials are selected so as to produce the first and second compositions.

19. The system according to claim 15, wherein the definition specifies a composition of the solder bump that includes different, first and second materials, and wherein the transparent donor substrate comprises first and second donor films comprising the first and second materials, respectively, wherein the controller is configured to drive the printing station to direct first and second sequences of the pulses to impinge respectively on the first and second donor films so that the droplets deposited at the target location cumulatively reach the specified composition, and wherein the definition specifies a gradient of the materials in the composition of the solder bump, and wherein the controller is configured to drive the printing station to deposit the droplets of the first and second materials in multiple layers on the target location in accordance with the specified gradient.

20. The system according to claim 15, wherein the controller is configured to drive the printing station to deposit the droplets in multiple layers on the target location so as to reach the specified bump volume.

21. The system according to claim 20, wherein the controller is configured to drive the printing station and the reflow station to alternately deposit a layer of droplets and heat the layer to melt the droplets multiple times until the specified bump volume is reached.

22. The system according to claim 15, wherein the definition specifies a shape of the solder bump, and wherein the controller is configured to drive the printing station to direct the sequence of the pulses so as to deposit the molten droplets in a pattern that conforms to the specified shape.

23. The system according to claim 15, wherein the printing station is configured to print a conductive pad at the target location on the acceptor substrate using a process of laser-induced forward transfer (LIFT), and to deposit the molten droplets of the solder material on the printed conductive pad.

24. The system according to claim 23, wherein the printing station is configured to print the conductive pad with a concavity for deposition of the molten droplets therein.

25. A method for circuit fabrication, comprising:
positioning a transparent donor substrate having opposing first and second surfaces and a donor film comprising a specified solder material on the second surface such that the donor film is in proximity to the target location on the acceptor substrate;
ejecting molten droplets of the solder material toward a target location by directing a sequence of pulses of laser radiation to pass through the first surface of the donor substrate and impinge on the donor film so as to induce ejection from the donor film onto the target location on the acceptor substrate of the molten droplets of the solder material such that the droplets deposited at the target location cumulatively reach the specified bump volume; and
focusing one or more pulses of a laser beam onto the target location with sufficient energy to cause the deposited droplets to melt and reflow so as to form solder bumps.

26. The method according to claim 25, wherein the pulses have a pulse duration no greater than 1 ms.

27. The method according to claim 26, wherein the pulses have a pulse duration less than 100 µs.

28. The method according to claim 25, wherein the pulses have a pulse energy no greater than 3 mJ.

29. The method according to claim 25, wherein focusing the one or more pulses comprises focusing a single, respective pulse of the laser beam onto each of the target locations.

* * * * *